United States Patent
Gopal et al.

(10) Patent No.: US 9,853,660 B1
(45) Date of Patent: Dec. 26, 2017

(54) TECHNIQUES FOR PARALLEL DATA COMPRESSION

(71) Applicant: INTEL CORPORATION, Santa Clara, CA (US)

(72) Inventors: Vinodh Gopal, Westborough, MA (US); Kirk S. Yap, Westborough, MA (US); Daniel F. Cutter, Maynard, MA (US); James D. Guilford, Northborough, MA (US); Wajdi K. Feghali, Boston, MA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/468,061

(22) Filed: Mar. 23, 2017

(51) Int. Cl.
H03M 7/00 (2006.01)
H03M 7/34 (2006.01)
H03M 7/30 (2006.01)
H03M 7/40 (2006.01)

(52) U.S. Cl.
CPC ........... *H03M 7/3086* (2013.01); *H03M 7/40* (2013.01)

(58) Field of Classification Search
CPC ......... H03M 7/3086; H03M 7/40; H03M 7/00
USPC ..................................................... 341/50, 51
See application file for complete search history.

(56) References Cited

U.S. PATENT DOCUMENTS

| | | | | |
|---|---|---|---|---|
| 6,754,394 B2* | 6/2004 | Boliek | ..................... | H03M 7/30 375/E7.016 |
| 8,279,096 B2* | 10/2012 | Nov | ......................... | H03M 7/30 341/106 |
| 8,988,257 B2* | 3/2015 | Dickie | ................ | H03M 7/4037 341/106 |
| 9,087,070 B2* | 7/2015 | Francis | ............. | G06F 17/30153 |

\* cited by examiner

*Primary Examiner* — Jean B Jeanglaude

(57) ABSTRACT

Techniques and apparatus for parallel data compression are described. An apparatus to provide parallel data compression may include at least one memory and logic for a compression component, at least a portion of the logic comprised in hardware coupled to the at least one memory, the logic to provide at least one data input sequence to a plurality of compression components, determine compression information for the plurality of compression components, and perform a compression process on the at least one data input sequence via the plurality of compression components to generate at least one data output sequence, the plurality of compression components to perform the compression process in parallel based on the compression information.

25 Claims, 10 Drawing Sheets

TECHNIQUES FOR PARALLEL DATA COMPRESSION

TECHNICAL FIELD

Embodiments herein generally relate to information processing, and more particularly, to data compression techniques.

BACKGROUND

Developers of computing and network technologies are under increased demand to store and deliver expanding volumes of data. Compression processes may be employed to reduce the size of data without sacrificing the information contained within the data. For example, internet services may use compression techniques to decrease the bandwidth required for network traffic. In another example, a data storage system may use compression to reduce the amount of storage space required to store data. For critical applications within a cloud computing environment, large amounts of data need to be stored reliably and in a cost-effective manner. In addition, the data volume may be increased because nodes generating data replicate and/or broadcast the data to additional nodes to ensure data resiliency. Accordingly, data compression techniques are needed that are capable of high compression ratios while minimizing use of processor resources.

DETAILED DESCRIPTION

Figure 1:
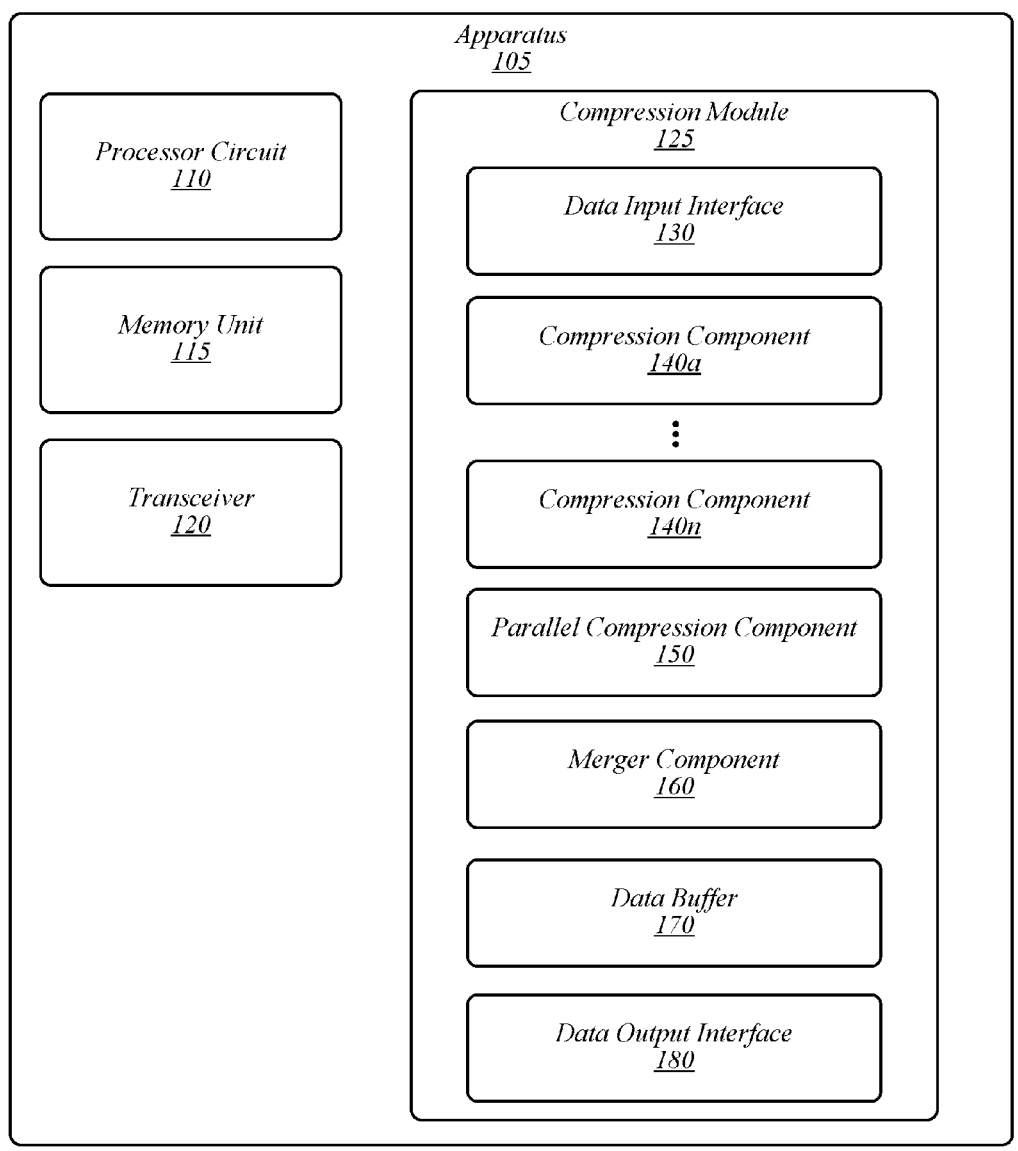
FIG. 1 illustrates an embodiment of a first operating environment.

Various embodiments may be generally directed to techniques for data compression provided by a computer system. The computer system may include a compression module having a plurality of compression components operative to compress data. The plurality of compression components may be configured to compress one or more input data sequences (or streams) in parallel with each other. In an embodiment, the plurality of compression components may operate to compress an individual data stream in parallel. In another embodiment, the plurality of compression components may operate to compress a plurality of data streams in parallel. In one embodiment, for example, an apparatus to provide parallel data compression may include at least one memory and logic for a compression component, at least a portion of the logic comprised in hardware coupled to the at least one memory, the logic to provide a first data input sequence to a plurality of compression components, determine compression information for the plurality of compression components, and perform a compression process on the first data input sequence via the plurality of compression components to generate at least one data output sequence, the plurality of compression components to perform the compression process in parallel based on the compression information.

Various embodiments may comprise one or more elements. An element may comprise any structure arranged to perform certain operations. Each element may be implemented as hardware, software, or any combination thereof, as desired for a given set of design parameters or performance constraints. Although an embodiment may be described with a limited number of elements in a certain topology by way of example; the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

In general, developers generate and/or modify compression processes to achieve a good compression ratio. However, higher compression ratios generally require increased processing and, therefore, may adversely affect the throughput of an application and/or data stream. Conventional compression engines may compress data to, for example, gzip level 9 ratios and may operate on about 2 Gbits/sec on a single stream of data. Current data demands indicate that compression solutions configured to handle projected data storage and provision requirements may necessitate about at least 25 GBits/sec. In addition, compression processes may require low latency solutions that employ small data buffers. Therefore, viable solutions may not rely on large-grained parallelism that operates by breaking up large files into smaller chunks. Accordingly, some embodiments are capable of achieving the highest-level compression ratios (for instance, level 9) at extremely high single-stream performance rates.

FIG. 1 illustrates an example of an operating environment 100 that may be representative of various embodiments. The operating environment 100 depicted in FIG. 1 may include an apparatus 105 having a processor circuit 110, a memory unit 115, and a transceiver 120. Processor circuit 110 may include and or may access logic having instructions for performing operations according to some embodiments. Processor circuit 110 may be communicatively coupled to memory unit 115 and/or transceiver 120.

As shown in FIG. 1, apparatus 105 may include a compression module 125. In various embodiments, compression module 125 may include or be disposed within a processor circuit, such as processor circuit 110, a system-on-a-chip (SoC), a field-programmable gate array (FPGA), and/or the like. In some embodiments, compression module 125 may include a processor circuit. In some embodiments, compression module 125 may be implemented in software, firmware, hardware, or any combination thereof. In various embodiments, compression module 125 may be implemented in hardware configured to execute software, firmware, and/or the like to perform operations according to some embodiments.

Compression module 125 may include a data input interface 130 configured to access data, for example, to be compressed via compression module 125 (for instance, "uncompressed data"). Data input interface 130 may receive data input from various sources, including software applications or threads, hardware elements, data buffers, and/or the like. In various embodiments, the uncompressed data in the form of a data sequence or stream may be received or otherwise accessed by compression module 125 via data input interface 130. A data buffer 170 may be used to store data, such as intermediate data, data waiting to be compressed, compressed data waiting to be transmitted, and/or the like. Furthermore, compression module 125 may include a data output interface 180 operative to output a compressed data stream generated by compression module 125. In some embodiments, data output interface 180 may access compressed data stored within data buffer 170 for transmission to a consumer of the compressed data (for instance, a software application, an apparatus component, such as processor circuit 110, transceiver 120, and/or the like).

In some embodiments, compression module 125 may include a plurality of compression components 140*a-n*. In some embodiments, compression components 140*a-n* may be implemented in hardware, software, firmware, or any combination thereof. In various embodiments, compression components 140*a-n* may include a compression engine, algorithm, process, software application, firmware application, processor, co-processor, FPGA, and/or the like. In some embodiments, compression components 140*a-n* may include a plurality of compression components. In some embodiments, compression components 140*a-n* may include a plurality of instances of a single compression component. Compression components 140*a-n* may include various numbers of compression components (or instances of compression components). For example, compression module 125 may include 1, 2, 3, 4, 5, 10, 15, 16, 25, 32, 64, 100, 500, 1000, 5000, 10,000, or any value or range between any of these values (including endpoints) compression components (or instances of compression components).

In general, compression components 140*a-n* may be configured to encode or compress data using one or more compression processes (for example, compression, decompression, recompression, encoding, decoding, and/or the like). Non-limiting examples of compression processes may include lossless data compression, Lempel-Ziv (LZ), LZ77, LZ4, LZFX, LZSS, Deflate, Snappy, Huffman encoding, compressed adaptive index (COMPAX), improved COMPAX (ICX), single-pass recompression (SPR), and/or the like. Although LZ77 and Deflate are used as examples, embodiments are not so limited. In particular, compression processes capable of operating according to some embodiments are contemplated herein.

In various embodiments, compression components 140*a-n* may access or otherwise receive input data, for example, from data input interface 130. In some embodiments, compression components 140*a-n* may compress input data in parallel using various modes or processes. For example, each of compression components 140*a-n* may operate to compress one of a plurality of different data streams (a "parallel multi-stream compression" process or mode). In another example, each of compression components 140*a-n* may operate to compress a single data stream (a "parallel single-stream compression" process or mode). Compression module 125 may receive or determine a compression mode indicator that may operate as a "switch" to switch compression between various modes or processes. For instance, compression module 125 may receive a compression mode indicator to operate in a parallel multi-stream compression process or mode. In another instance, compression module 125 may receive a compression mode indicator to switch to a parallel single-stream compression process or mode.

In some embodiments, only a portion of compression components 140*a-n* may operate to compress input data, while another portion of compression components 140*a-n* may be idle or otherwise not active compressing input data. In some embodiments, compression components 140*a*-n may process input data to generate output data in the form of compressed data, compression records, and/or the like (see, for example, FIGS. 4 and 5).

In some embodiments, compression module 125 may include a parallel compression component 150. In general, parallel compression component 150 may operate to control, manage, instruct, or otherwise implement parallel compression by compression components 140*a-n*. In some embodiments, parallel compression component 150 may determine whether to perform parallel multi-stream compression or parallel single-stream compression for one or more input data streams. In some embodiments, parallel compression component 150 may determine, receive, transmit, generate, or otherwise process compression information associated with performing a compression process using compression components 140*a-n*. Non-limiting examples of compression information may include the number of compression components 140*a-n* participating in a compression process, compression offset(s), skip values, compression level, compression type, and/or the like.

During parallel multi-stream compression, the data output by compression components 140*a-n* may be provided to merger component 160. For example, compression components 140*a-n* may process input data and generate compression records that are provided to merger component 160 for further processing according to some embodiments to generate compressed output data. In some embodiments, merger component 160 may be implemented in hardware, software, firmware, or any combination thereof. In some embodiments, merger component 160 may include a multiplexer implemented in hardware, software, firmware, or any combination thereof. In various embodiments, merger component 160 may be implemented in hardware or substantially in hardware. Merger component 160 may operate to merge the compressed data output from compression components 140*a-n*, by performing parallel multi-stream compression, into one or more compressed data streams.

In some embodiments, compression components 140*a-n* may employ LZ77 compression. In some embodiments, compression components 140*a-n* may employ Deflate compression. In general, the LZ77 compression process operates by replacing repeated occurrences of data with references to a single copy of that data existing earlier in the input (uncompressed) data stream. A match is encoded by a pair of numbers called a length-distance pair ("distance" may be referred to as an "offset"). As such, the LZ77 compression process finds repeated substrings and replaces them with backward references (relative distance offsets). The LZ77 compression process can use a reference to a duplicated string if the relative distance is less than the maximal history size defined in the algorithm encoding (for instance, 32 KB in Deflate). The compressed data consists of a series of elements of two types: literal bytes (copy of the data) and pointers to replicated strings, where a pointer is represented as the pair <length, backward distance>. The various algorithms in the LZ77 family all find LZ77 string matches during compression, but encode the literals or references differently (for instance, Huffman codes in Deflate, simple byte-oriented packing in Snappy, and/or the like), and have different maximal history windows. In general, a literal may include raw encoded data (as opposed to data encoded as a length, distance pair).

To spot matches, the LZ77 encoder keeps track of some amount of the most recent data, such as the last 2 kB, 4 kB, 32 kB, and/or the like. The structure in which this data is held is called a "sliding window" (accordingly, LZ77 is sometimes referred to as sliding window compression). The encoder keeps the most recent data within the sliding window to look for matches (and the decoder likewise will keep this data to interpret the matches the encoder refers to).

During LZ77 compression, bit patterns of a preceding (earlier or older) portion of a bit stream may be compared against a current portion (or current bit sequence) of the bit stream. If a sequence of bits is found in the current portion that matches a sequence of bits in the preceding portion (or preceding bit sequence), the sequence of bits in the current portion is replaced with a reference to the same sequence of bits in the earlier portion.

The reference that is inserted for the current bit sequence identifies the length of the current bit sequence and the location of the preceding bit sequence expressed, for instance, as a "distance" from the current bit sequence to the matching preceding bit sequence. As such, the LZ77 compression process encodes a bit sequence as a "length, distance pair" that is inserted in the bit stream in place of a current bit sequence. Upon decoding the compressed stream, when the decoder reaches the length, distance pair that is embedded in the bit stream, the decoder uses the distance part of the length, distance pair to refer back to the start of the matching bit sequence and reproduces the correct bit sequence of the decoded stream by reproducing a number of bits from the start of the matching bit sequence that is equal to the length component of the length, distance pair.

A non-limiting example of an LZ77 compression process may be performed on the following illustrative sequence, recited in a form prior to compression: "AAAA BBBB CC DDD EEEE BBBB FFFF." During compression, the LZ77 compression process may locate the match "BBBB," having a length of 6 (including spaces). The matching "BBBB" sequences have a match offset (for instance, an intervening distance) of 17. The compressed sentence may be in the following form: "AAAA BBBB CC DDD EEEE@(6,17) FFFF," with "(6,17)" being the length and distance pair associated with the BBBB match.

The Deflate compression process is used as the bases of various compression platforms, such as gzip/Zlib and Winzip/PKzip. In general, Deflate uses a series of blocks corresponding to successive blocks of input data. Each block may be compressed using a combination of the LZ77 compression process and Huffman coding. As described above, the LZ77 compression process operates to find repeated substrings and replaces the repeated substrings with references, such as relative distance offsets. The LZ77 compression process may use a reference to a duplicated string occurring in the same block or previous blocks, for instance, up to 32 KB previous input bytes. The compressed data may include a series of elements of two types: literal bytes and pointers to replicated strings (represented as the pair: <length, backward distance>. The LZ77 compression process operates to find string matches at each position.

Using data structures to efficiently index locations where matching strings may be found, the LZ77 compression process may operate to search a number of locations to determine a "best" match. The effort (for instance, the number of searches attempted) is specified by the compression level. For instance, gzip/Zlib defines a number of compression levels, ranging from 1 to 9, with 9 being the highest compression level and requiring the highest processing cost. A file may be represented as a series of tokens, where each token may represent a literal byte or a match of text that occurred previously. The tokens may be encoded using a variable-size code (for instance, a Huffman code followed by certain "extra bits").

Because the codes are of variable length, a simple strategy of trying to minimize the number of tokens may likely not result in the smallest output. For example, a 10-byte match that occurred a large distance previously in the data stream may take more bits to encode than a literal followed by a 9-byte match that is closer. In another example, an input sequence having a 10-byte match may be followed by two literal tokens, while if the first byte of that sequence were represented by a literal, an 11-byte match may be located. Accordingly, Deflate may use "lazy matching" in which the compression process may find a match at a given point, then look for a match one byte further and if the second match is longer than the first match, the compression process emits a literal. In general, lazy matching involves the compression process optionally deferring the selection of matches. For example, after a match of length X has been found, the compression process searches for a longer match starting at the next input byte. If the compression process finds a longer match, the compression process truncates the previous match to a length of one (thus producing a single literal byte) and then emits the longer match. Otherwise, the compression process emits the original match, and advances N bytes before continuing.

Figure 2:
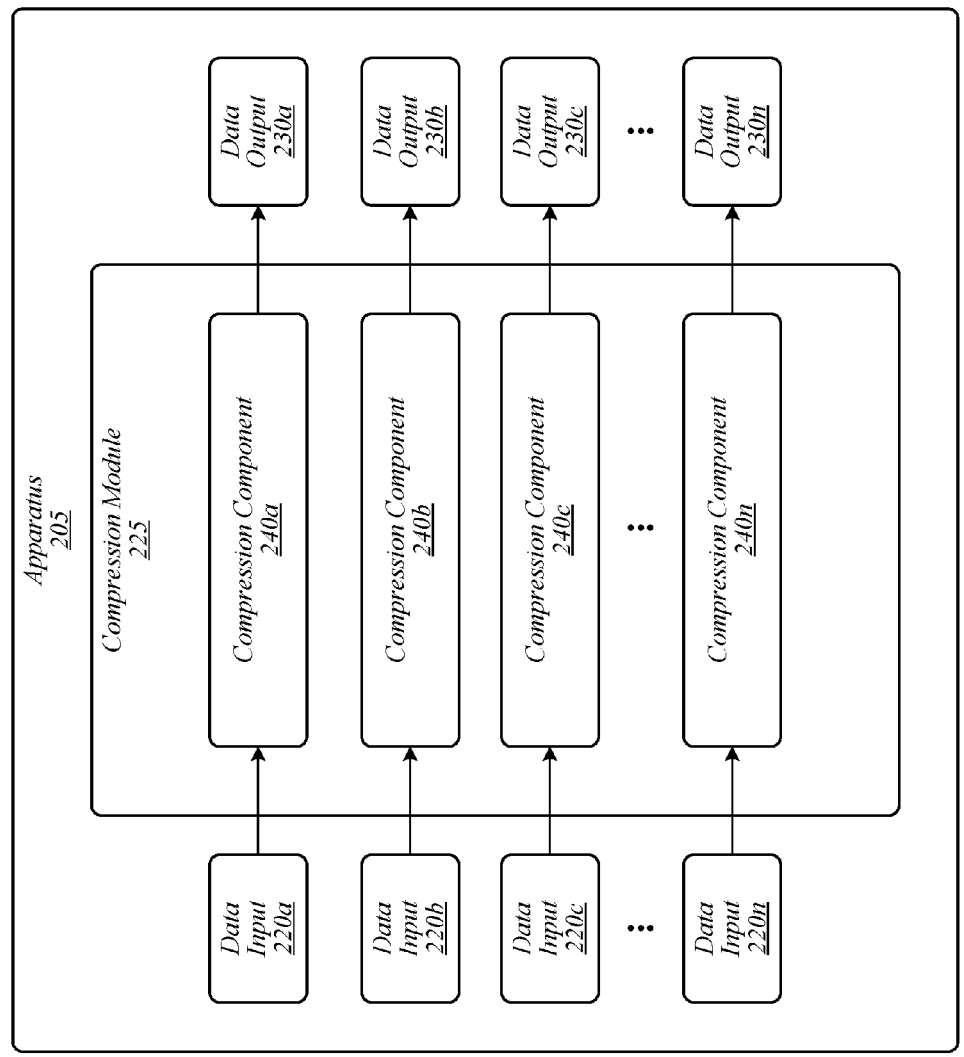
FIG. 2 illustrates an embodiment of a second operating environment.

FIG. 2 illustrates an example of an operating environment 200 that may be representative of various embodiments. The operating environment 200 depicted in FIG. 2 may include an apparatus 205 having a compression module 225. As shown in FIG. 2, compression components 240$a$-$n$ may be operative performing parallel compression. In particular, compression components 240$a$-$n$ may operate to perform parallel multi-stream compression in which each of compression components 240$a$-$n$ are compressing different data inputs 220$a$-$n$ (for instance, data streams). Each of compression components 240$a$-$n$ may compress data inputs 220$a$-$n$ to generate data outputs 230$a$-$n$ (for example, output data streams) that include compressed data. In some embodiments, data outputs 230$a$-$n$ may be provided to a data consumer, such as an internal application or hardware component of apparatus 205.

In some embodiments, compression components 240$a$-$n$ may compress data inputs 220$a$-$n$ at one or more compression levels or ratios. For example, compression components 240$a$-$n$ may compress data inputs 220$a$-$n$ at gzip compression level 9. In various embodiments, compression components 240$a$-$n$ may compress data inputs 220$a$-$n$ at a same compression level. In various embodiments, one or more of compression components 240$a$-$n$ may compress data inputs 220$a$-$n$ at one or more different compression levels. For example, compression component 240$a$ may compress data input 220$a$ at a first compression level (for instance, compression level 6) while compression component 240$b$ may compress data input 220$b$ at a second compression level (for instance, compression level 9). In some embodiments, the compression level for each of compression components 240$a$-$n$ may be determine or specified by parallel compression module 150. In this manner, compression module 225 may operate in an efficient throughput mode on multiple independent data streams, with each compression engine (compression module 240$a$-$n$) operating at its own (and possibly different) compression level.

In some embodiments, compression module 225 may operate to determine compression information for one or more of compression components 240a-n. In general, compression information specifies one or more aspects of compression to be performed by compression components 240a-n. Illustrative and non-restrictive examples of compression information may include a number of active compression components 240a-n, destinations for data inputs 220a-n, compression level, compression type (for instance, LZ77, Defined, Snappy, and/or the like), destinations for data outputs 230a-n, and/or the like. The parallel compression module 150 may determine compression information for one or more of compression components 240a-n based on various compression factors. Non-limiting examples of compression factors may include compression instructions, preferences, available resources (for instance, higher compression rate when there are more available resources), number of active compression components, type of data (for instance, a video stream, an audio stream, and/or the like), compressed data destination, and/or the like. For instance, a data center may specify a default compression level for video stream data. In another instance, compression module 225 may determine a compression level based on available processing resources (for instance, a higher compression level during high resource availability and vice versa). In a further instance, compression module 225 may specify a first compression type for a first type of data (for instance, a video stream) and a second compression type for a second type of data (for instance, bitmap files). In some embodiments, parallel compression module 150 may perform an individual determination of compression information for each of compression components 240a-n.

In various embodiments, compression components 240a-n may be configured to vary a number of searches done at any position over a wide range to achieve different compression levels (for example, compression levels 1 to 9 by varying the number of searches from 1 to 200). In some embodiments, compression components 240a-n may be capable of updating internal indexing data structures, for example, at a high rate (for instance, greater than 1 update per cycle), which is a simple operation compared to searching/comparing strings to find best matches.

Figure 3:
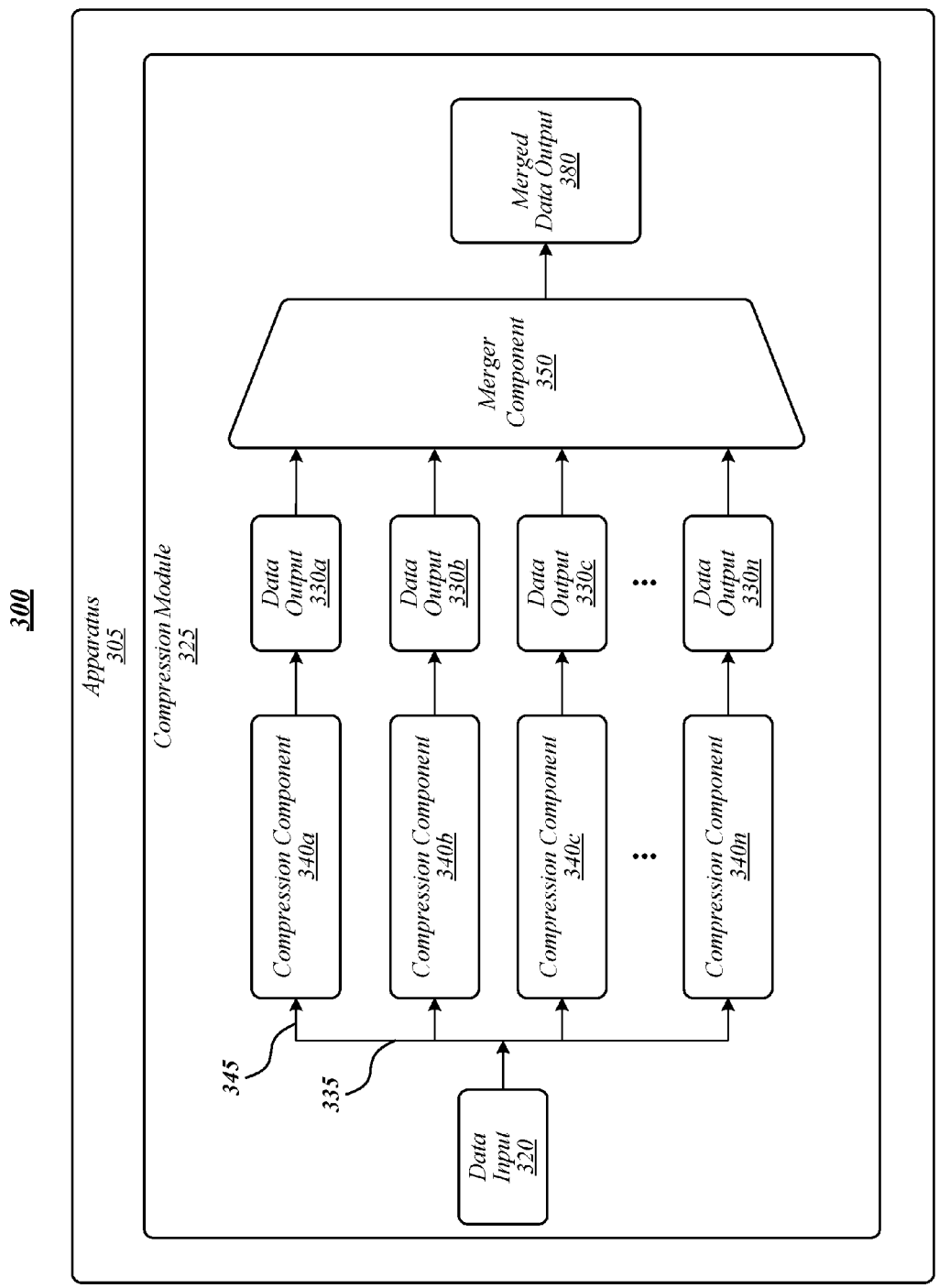
FIG. 3 illustrates an embodiment of a third operating environment.

FIG. 3 illustrates an example of an operating environment 300 that may be representative of various embodiments. The operating environment 300 depicted in FIG. 3 may include an apparatus 305 having a compression module 325. As shown in FIG. 3, compression module 325 may include a plurality of compression components 340a-n configured to perform parallel single-stream compression according to some embodiments. A single data input 320 (for instance, a data stream) may be provided to compression components 340a-n. For example, data input 320 may be demultiplexed by demultiplexer 335 into a plurality of duplicate streams 345 and provided to compression components 340l-n. In some embodiments, each of the plurality of duplicate streams 345 may be identical or substantially identical to data input 320. In some embodiments, one or more of the plurality of duplicate streams 345 may not be identical or substantially identical to data input 320 (for example, the plurality of duplicate streams 345 may only include one or more portions of data input 320).

In some embodiments, data input 320 may be divided into one or more segments and each segment may be provided to a compression component 340a-n for compression. In some embodiments, each of compression components 340a-n may each operate on undivided data input 320 in parallel. In some embodiments, compression module 325 may operate, such as via parallel compression module 150, to determine compression information for one or more of compression components 340a-n according to some embodiments. In some embodiments, each of compression components 340a-n may operate using the same or substantially the same compression level. In some embodiments, one or more of compression components 340a-n may operate using a different compression level.

As depicted in FIG. 3, each compression component 340a-n may provide data output 330a-n that includes compressed data from data input 320. In some embodiments, each of data outputs 330a-n may include compressed data from a corresponding segment of data input 320. Data outputs 330a-n may be provided to merger component 350 that is configured to merge data outputs 330a-n into merged data output 380, for example, to form a compressed data stream. Accordingly, multiple of compression components 340a-n may operate to compress segments of data input 320 in parallel and, through merger component 350, generate a single merged data output 380. As such, in some embodiments, compression module 325 may operate parallel single-stream compression in which compression components 340a-c may operate in parallel on the same input data stream (data input 320) to generate an intermediate data feed (data output 330a-c) to merger component (or merger block) that generates a single output stream (merged data output 380).

As described herein, in some embodiments, compression components 340a-n may use an LZ77 compression process. In general, the LZ77 compression process may use and maintain various data structures (for instance, hash tables, linked lists, and/or the like) which may update at certain intervals, such as at every byte of the input data. At a subsequent position, the LZ77 compression process may attempt to find the longest matching sequence (for instance, a byte sequence or string) within a history window (for example, past 32 KB, 64 KB, and/or the like) of input that matches the sequence following a current position. Such matching is typically the most time and resource expensive operation which involves progressing through the data structures, finding possible offsets in the history, reading and comparing the sequences, and scoring and picking the best match. When the LZ77 compression engine locates a match of length M, the LZ77 compression engine may attempt to optimize performance. For example, the LZ77 compression engine may avoid performing the search operations at all M locations, thus skipping the locations searched up to M (the extent of skipping may depend on whether the LZ77 compression engine is performing lazy matching). If no match is found (or if lazy matching is being performed), searching may resume at the next byte position. In this manner, the LZ77 compression engine may constantly skip positions to search based on results of the matching.

In some embodiments, compression components 340a-n may operate to always skip by a configured amount independent of the matches being found (a "skip value"). In various embodiments, the skip value may be set to the number of active compression components 340a-n. In some embodiments, compression components 340a-n may start searching at an offset (a "start offset") from the start of the input. For example, compression components 340a-n may start compressing data input 320 (or a particular segment of data input 320) based on a number of compression components 340a-n active in compressing data input 320. For instance, if there are 16 active compression components, a first compression component 340a may have a start offset of 0, a second compression component 340b may have a start offset of 1, and so on, with each of the active compression components set to skip exactly 16 (for example, 16 positions). The skip value, for example, may be set to 16. Accordingly, the first compression component 340a may search at the following positions: 0, 16, 32, and so on; the second compression component 340b may search at the following positions: 1, 17, 33, and so on; and the sixteenth compression component 340p may search at the following positions 15, 31, 47, and so on. In this manner, collectively, the active compression components 340a-n may search every single position of data input 320 in parallel.

In some embodiments, each of active compression components 340a-n may operate using the same compression information, such as a same compression type and/or compression level. In some embodiments, one or more of compression components 340a-n may operate using different compression information, such as a different compression type and/or compression level. In some embodiments, each active compression component 340a-n may update at every position.

Figure 4:
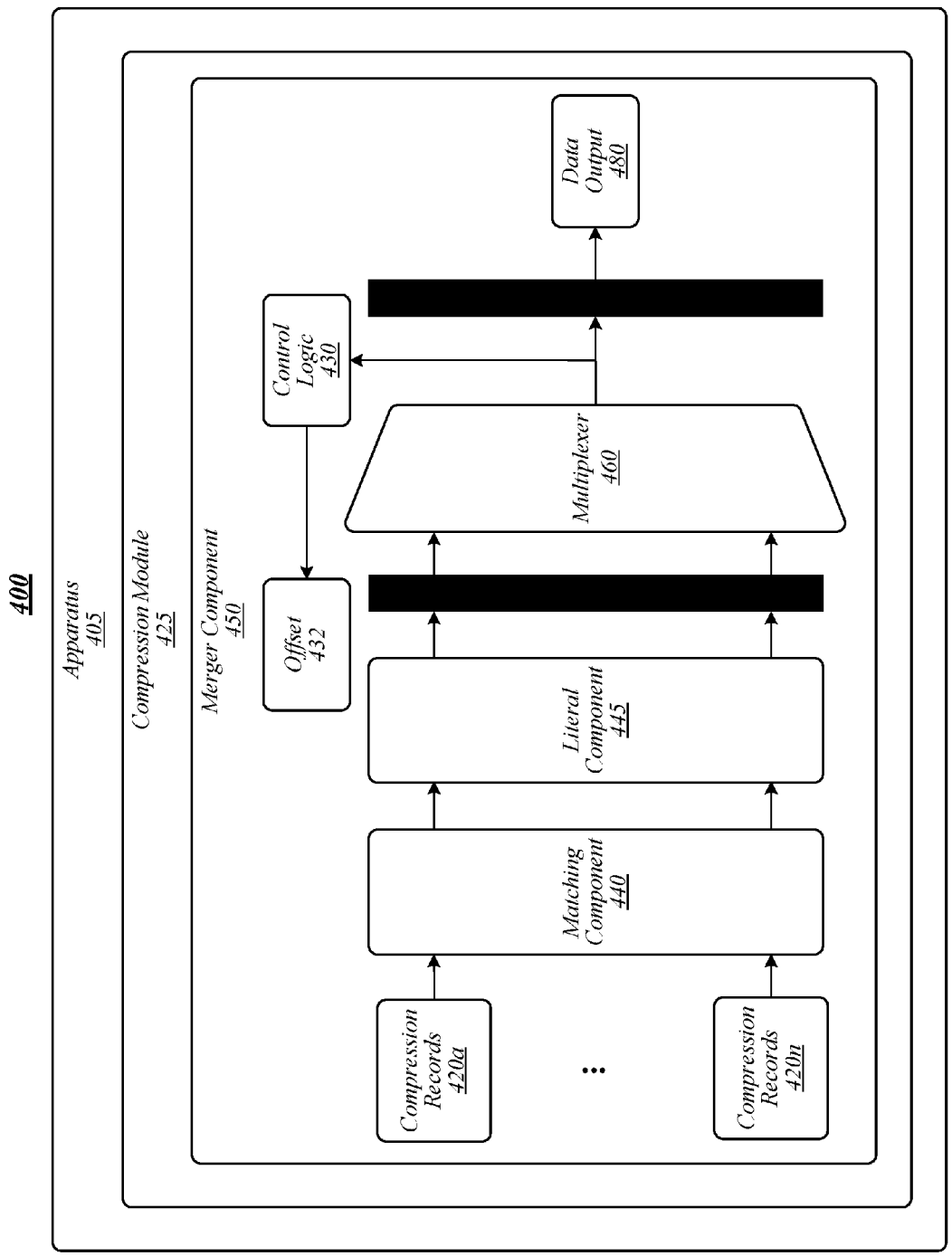
FIG. 4 illustrates an embodiment of a fourth operating environment.

FIG. 4 illustrates an example of an operating environment 400 that may be representative of various embodiments. The operating environment 400 depicted in FIG. 4 may include apparatus 405 having a compression module 425 with a merger component 450. As shown in FIG. 4, merger component 450 may receive, obtain, or otherwise access compression records 420a-n generated by compression components, such as compression components 340a-n. Compression records 420a-n may include compression record information associated with results of a compression process performed by compression components according to some embodiments (see, for example, FIG. 5).

Figure 5:
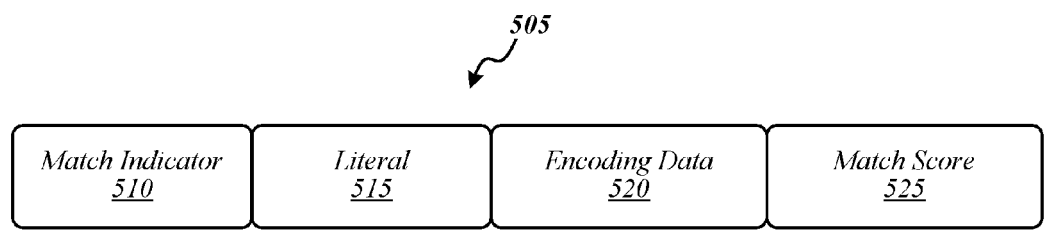
FIG. 5 illustrates an example of a compression record according to an embodiment.

Referring to FIG. 5, therein is depicted an illustrative compression record 505 according to an embodiment. In general, a compression record 505 may be configured to refer to a match and an associated length and distance for a given position. As shown in FIG. 5, a compression record 505 may include a match indicator 510 indicating whether there is a match or no match, a literal (or literal indicator) 515 indicating a literal byte at a corresponding position, encoding data 520 providing the length and distance associated with the match, and a match score 525 providing a numerical value indicating a quality of a match (for example, how "good" the match is). In some embodiments, the quality of a match may indicate or be associated with a level of confidence in the match. For instance, the higher the quality of a match, the lower the probability that the match is incorrect or otherwise inferior to an exact match, and vice versa.

In some embodiments, the match indicator 510 may include one or more bits, such as a sequence of bits, indicating whether or not a match is associated with the compression record 505. In some embodiments, the match indicator 510 may include a binary value, such as "1" for a match and a "0" for no match. In some embodiments, the match score 525 may include any value capable of indicating a quality of a match. For example, the match score 525 may include a value on a predetermined numerical range (for instance, on a range of 0-10, 0-100, and/or the like). In another example, the match score 525 may include a grade (for instance, a letter grade) or a sequence indicating quality or confidence in the match (for instance, low, high, and/or the like). Embodiments are not limited in this context.

Returning to FIG. 4, the merger component 450 may operate to merge all the compression records 420a-n into a single valid stream of compression records (for instance, a valid stream of LZ77 records). Matching component 440 receives, obtains, or otherwise accesses compression records 420a and performs a matching process on compression records 420a-n. In some embodiments, the matching process may include a lazy matching process. As described above, the compression records 420a-n may be generated by compression components, such as compression components 340a-n, that are working on positions that are not adjacent to each other as each compression component operates at a specified start offset. Accordingly, in various embodiments, matching component 440 may coordinate processing of compression records 420a-n. For instance, when all of the compression records 420a-n for a given position become available, matching component 440 may perform the matching process (such as lazy matching) by comparing the match score of the relevant compression records 420a-n. For example, for a lazy match (for instance, a lazy match having a match score of 2) at position X, matching component 440 may wait for records for positions X and X+1 to be valid and compare the match scores. If position X+1 has a better match score, the compression record 420a-n at position X may be replaced by a literal record.

The output of matching component 440a may be provided to a literal component 445. In some embodiments, literal component 445 may operate to merge consecutive literal bytes. After compression records 420a-n have been processed by matching component 440 and literal component 445 (for instance, after merger component has performed lazy matching and merging of consecutive literal bytes on compression records 420a-n), compression records 420a-n may be latched in a first processing stage and represent the final compression records for that particular position. In some embodiments, the worst-case throughput of merger component 450 may be controlled to at least 2 bytes per cycle by redefining the output of the merging process (for instance, to provide data output 480) to allow 2 bytes of literals in a single compression record 420a-n. This functionality may be achieved by detecting consecutive literal bytes, for instance, via literal component 445, and concatenating the bytes accordingly after the matching process has been performed by matching component 440.

The final compression records 420a-n may be provided to multiplexer 460. In some embodiments, multiplexer 460 may include an N:1 multiplexer. In various embodiments, multiplexer 460 may operate to select final compression records 420a-n to be provided as data output 480 to a data consumer. In some embodiments, control logic 430 (for instance, a state machine) may operate to control the process of the merger by advancing a pointer (for instance, a current offset) based on the record at the current position.

Compression module 425, for instance, via merger component 450 may perform various compression processes according to some embodiments described herein to generate data output 480 (and/or data output 230a-n and/or merged data output 380). For example, a compression process may include a merging process operative to generate final output of a compression process (for instance, data output 230a-n, merged data output 380, and/or data output 480). The following is a non-limiting example of a merging process in pseudo-code form, where pos is a byte position in an input stream, S is a size of the input stream, and N is a number of compression components:

Pos=0;
While (pos<S){
Mux-set=pos modulo N
Dequeue records from intermediate-stream[mux-sel] until record for position pos is obtained
If (record==1 Literal) {encode Literal, pos++}

If (record==2 Literals) {encode Literal1, encode Literal2, pos=pos+2}
If (record==Match) {encode <len, dist>, pos=pos+len}
}.

In this manner, the merging process may "jump around" selecting compression records (such as compression records 420a-n) from intermediate compression record streams. If the merging process encounters a long match, for instance, as indicated in a merger record, the merging process may discard some compression records until the compression record corresponding to the match is located. In addition, the merging process may wait for the corresponding compression record to arrive, for instance, from front-end compression processors. In some embodiments, when a match having a length greater than a match length threshold is encountered, the merging process may signal (for example, to a front-end compression processor) that only the record at position "pos" is required and there is no need to process pos-N, pos-2N, and so on, if not processed previously. The merging process according to some embodiments may be performed by one or more of compression modules 125, 225, 325, and/or 425, merger components 160, 350, and/or 450, or a combination thereof.

Included herein are one or more logic flows representative of exemplary methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, hardware, or any combination thereof. In software and firmware embodiments, a logic flow may be implemented by computer executable instructions stored on a non-transitory computer readable medium or machine readable medium, such as an optical, magnetic or semiconductor storage. The embodiments are not limited in this context.

Figure 6:
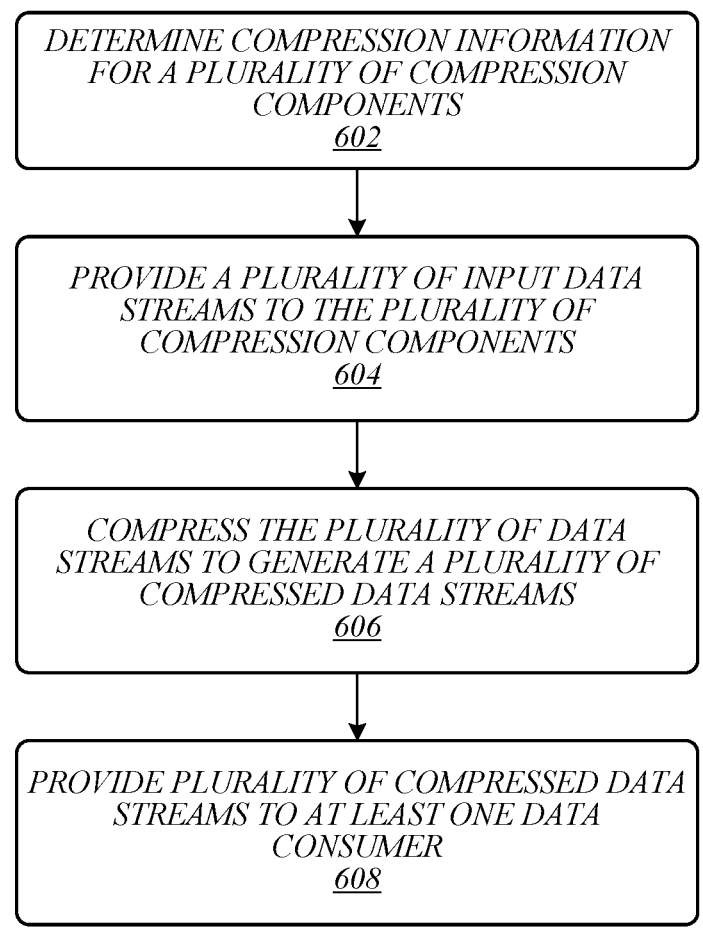
FIG. 6 illustrates an embodiment of a first logic flow.

FIG. 6 illustrates an embodiment of a logic flow 600. The logic flow 600 may be representative of some or all of the operations executed by one or more embodiments described herein, such as apparatus 105, 205, 305, and/or 405, for instance, via one of compression module 125, 225, 325, and/or 425. In some embodiments, logic flow 600 may be representative of some or all of the operations of a parallel multi-stream compression process.

In the illustrated embodiment shown in FIG. 6, logic flow 600 at block 602 may determine compression information for a plurality of compression components. In some embodiments, compression information may be generated, determined, or otherwise provided by parallel compression component 150. For example, compression module 225 may determine compression information for compression components 240a-n, including, without limitation, compression type, compression level, and/or the like. In some embodiments, the compression information may define which and how many compression components are active in a compression process, how one or more compression components are to operate, and/or the like. For example, the compression information may specify a compression level to be used by one or more of compression components 240a-n. In some embodiments, compression components may operate using different compression information. For example, certain compression components may operate at a different compression level than other compression components.

At block 604, logic flow 600 may provide a plurality of input data streams to the plurality of compression components. For instance, compression module 225 may provide data inputs 220a-n to compression components 240a-n. Non-limiting examples of data input 220a-n may include a data stream, such as a stream of text data, audio data, video data, image data, and/or the like. The logic flow may compress the plurality of data streams to generate a plurality of compressed data streams. For example, compression components 240a-n may perform a compression process in parallel (for instance, at the same time or substantially at the same time) on data inputs 220a-n, with each of compression components 240a-n operating on a different one of data inputs 220a-n. Compression components 240a-n may compress data inputs 220a-n to generate data outputs 230a-n. In some embodiments, data outputs 230a-n may include compression records, compressed data streams, and/or the like. At block 608, the plurality of compressed data streams 608 may be provided to at least one data consumer. Non-limiting examples of data consumers may include a software application or thread, a hardware device, a buffer, and/or the like.

Figure 7:
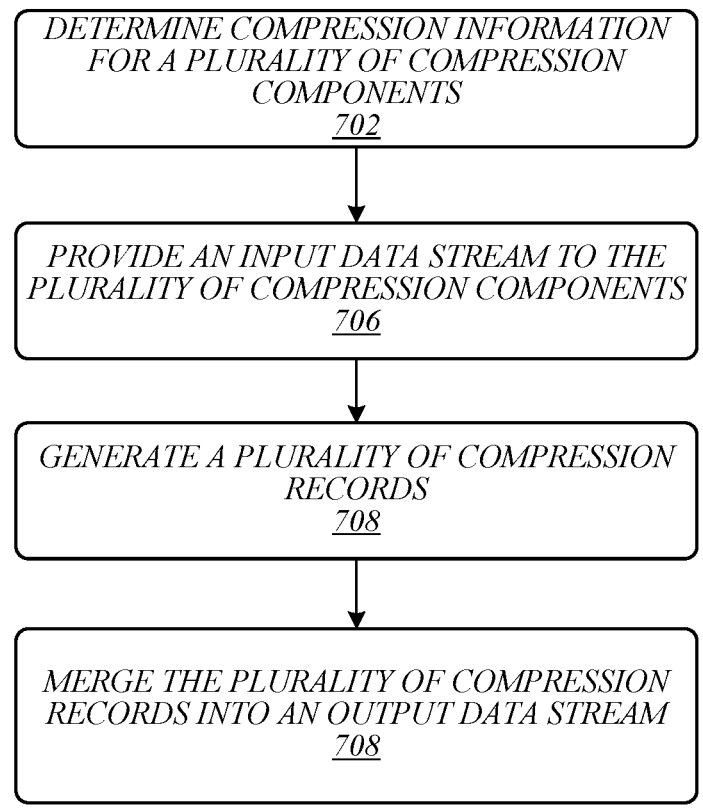
FIG. 7 illustrates an embodiment of a second logic flow.

FIG. 7 illustrates an embodiment of a logic flow 700. The logic flow 700 may be representative of some or all of the operations executed by one or more embodiments described herein, such as apparatus 105, 205, 305, and/or 405, for instance, via one of compression modules 125, 225, 325, and/or 425. In some embodiments, logic flow 700 may be representative of some or all of the operations of a parallel single-stream compression process.

In the illustrated embodiment shown in FIG. 7, logic flow 700 at block 702 may determine compression information for a plurality of compression components. For example, compression module 325 may determine compression information for compression components 340a-n. In some embodiments, compression information may include a number of compression components 340a-n active in a compression process and a start offset for each active compression component 340a-n.

At block 704, an input data stream may be provided to the plurality of compression components. For instance, data input 320 may be provided to compression components 340a-n. In some embodiments, data input 320 may include a single data stream. In some embodiments, data input 320 may be divided or demultiplexed into a plurality of duplicate streams 345 by demultiplexer 335. In various embodiments, although compression components 340a-n may be operating on separate inputs provided by demultiplexer 335, compression components 340a-n are collectively and in parallel operating on a single input data stream, namely, data input 320.

Logic flow 700 at block 706 may generate a plurality of compression records. For example, compression components 340a-n may process data input 320 to generate compression records, such as compression record 505. At block 708, the plurality of compression records may be merged into an output data stream. For instance, merger component 450 may operate to merge compression records 420a-n into a single data output 480 after compression records 420a-n have gone through a matching process via matching component 440 and literal processing via literal component 445.

Figure 8:
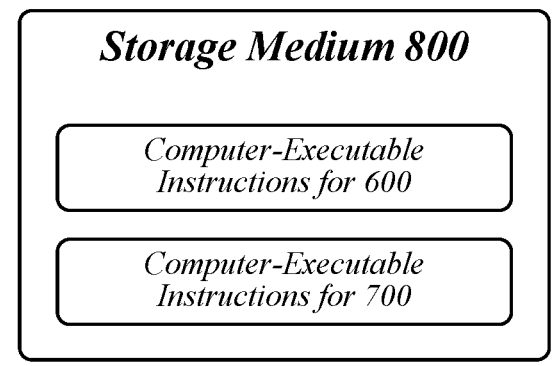
FIG. 8 illustrates an example of a storage medium.

FIG. 8 illustrates an example of a storage medium 800. Storage medium 800 may comprise an article of manufacture. In some examples, storage medium 800 may include any non-transitory computer readable medium or machine readable medium, such as an optical, magnetic or semiconductor storage. Storage medium 800 may store various types of computer executable instructions, such as instructions to implement logic flow 600 and/or logic flow 700. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9:
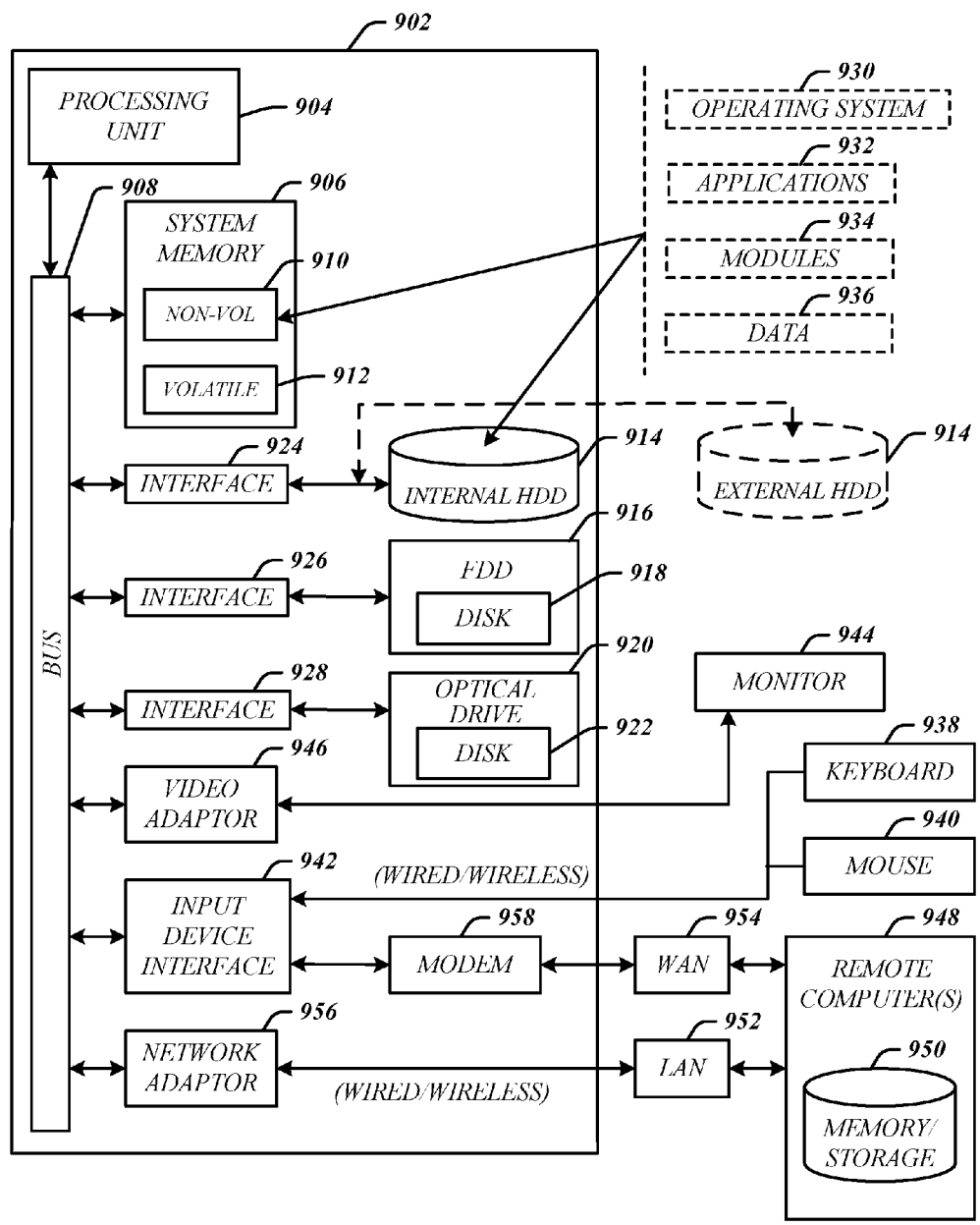
FIG. 9 illustrates an embodiment of a computing architecture.

FIG. 9 illustrates an embodiment of an exemplary computing architecture 900 suitable for implementing various embodiments as previously described. In various embodiments, the computing architecture 900 may comprise or be implemented as part of an electronic device. In some embodiments, the computing architecture 900 may be representative, for example, of apparatus 105, 205, 305, and/or 405. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 800. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 900 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 900.

As shown in FIG. 9, the computing architecture 900 comprises a processing unit 904, a system memory 906 and a system bus 908. The processing unit 904 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 904.

The system bus 908 provides an interface for system components including, but not limited to, the system memory 906 to the processing unit 904. The system bus 908 can be any of several types of bus structure that may further interconnect to a memory bus (with or without a memory controller), a peripheral bus, and a local bus using any of a variety of commercially available bus architectures. Interface adapters may connect to the system bus 908 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 906 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 9, the system memory 906 can include non-volatile memory 910 and/or volatile memory 912. A basic input/output system (BIOS) can be stored in the non-volatile memory 910.

The computer 902 may include various types of computer-readable storage media in the form of one or more lower speed memory units, including an internal (or external) hard disk drive (HDD) 914, a magnetic floppy disk drive (FDD) 916 to read from or write to a removable magnetic disk 918, and an optical disk drive 920 to read from or write to a removable optical disk 922 (e.g., a CD-ROM or DVD). The HDD 914, FDD 916 and optical disk drive 920 can be connected to the system bus 908 by a HDD interface 924, an FDD interface 926 and an optical drive interface 928, respectively. The HDD interface 924 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 910, 912, including an operating system 930, one or more application programs 932, other program modules 934, and program data 936. In one embodiment, the one or more application programs 932, other program modules 934, and program data 936 can include, for example, the various applications and/or components of apparatus 105, 205, 305, and/or 405.

A user can enter commands and information into the computer 902 through one or more wire/wireless input devices, for example, a keyboard 938 and a pointing device, such as a mouse 940. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 904 through an input device interface 942 that is coupled to the system bus 908, but can be connected by other interfaces such as a parallel port, IEEE 1394 serial port, a game port, a USB port, an IR interface, and so forth.

A monitor 944 or other type of display device is also connected to the system bus 908 via an interface, such as a video adaptor 946. The monitor 944 may be internal or external to the computer 902. In addition to the monitor 944, a computer typically includes other peripheral output devices, such as speakers, printers, and so forth.

The computer 902 may operate in a networked environment using logical connections via wire and/or wireless communications to one or more remote computers, such as a remote computer 948. The remote computer 948 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 950 is illustrated. The logical connections depicted include wire/wireless connectivity to a local area network (LAN) 952 and/or larger networks, for example, a wide area network (WAN) 954. Such LAN and WAN networking environments are commonplace in offices and companies, and facilitate enterprise-wide computer networks, such as intranets, all of which may connect to a global communications network, for example, the Internet.

When used in a LAN networking environment, the computer 902 is connected to the LAN 952 through a wire and/or wireless communication network interface or adaptor 956. The adaptor 956 can facilitate wire and/or wireless communications to the LAN 952, which may also include a wireless access point disposed thereon for communicating with the wireless functionality of the adaptor 956.

When used in a WAN networking environment, the computer 902 can include a modem 958, or is connected to a communications server on the WAN 954, or has other means for establishing communications over the WAN 954, such as by way of the Internet. The modem 958, which can be internal or external and a wire and/or wireless device, connects to the system bus 908 via the input device interface 942. In a networked environment, program modules depicted relative to the computer 902, or portions thereof, can be stored in the remote memory/storage device 950. It will be appreciated that the network connections shown are exemplary and other means of establishing a communications link between the computers can be used.

The computer 902 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Figure 10:
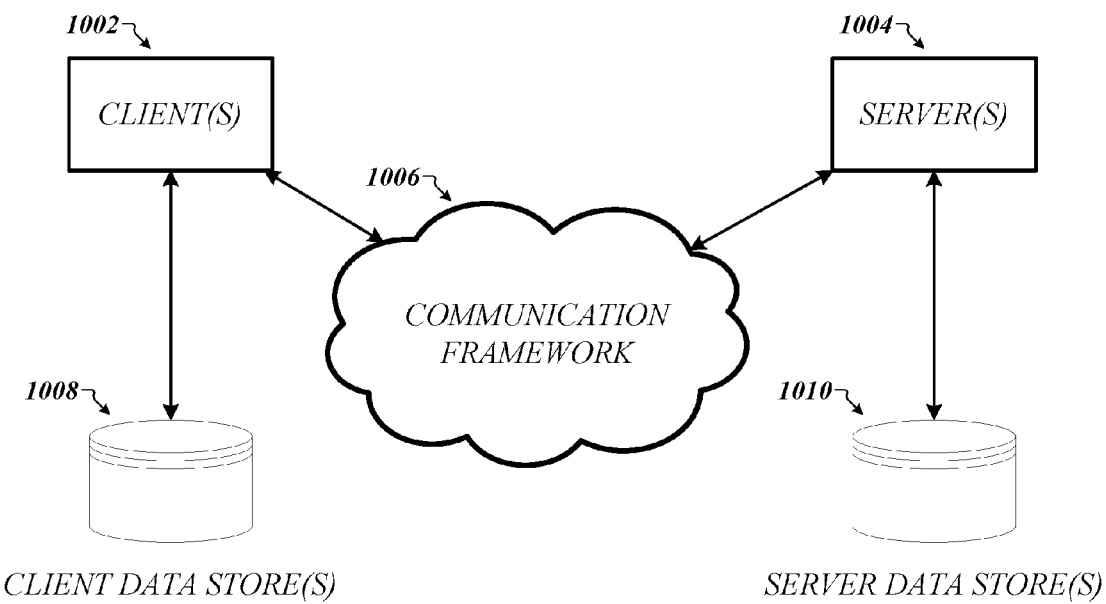
FIG. 10 illustrates an embodiment of a communications architecture.

FIG. 10 illustrates a block diagram of an exemplary communications architecture 1000 suitable for implementing various embodiments as previously described. The communications architecture 1000 includes various common communications elements, such as a transmitter, receiver, transceiver, radio, network interface, baseband processor, antenna, amplifiers, filters, power supplies, and so forth. The embodiments, however, are not limited to implementation by the communications architecture 1000.

As shown in FIG. 10, the communications architecture 1000 includes one or more clients 1002 and servers 1004. The clients 1002 and the servers 1004 are operatively connected to one or more respective client data stores 1008 and server data stores 1010 that can be employed to store information local to the respective clients 1002 and servers 1004, such as cookies and/or associated contextual information. Any one of clients 1002 and/or servers 1004 may implement one or more of apparatus 105, 205, 305, and/or 305, logic flows 600 and/or 700, storage medium 800, and/or computing architecture 900.

The clients 1002 and the servers 1004 may communicate information between each other using a communication framework 1006. The communications framework 1006 may implement any well-known communications techniques and protocols. The communications framework 1006 may be implemented as a packet-switched network (e.g., public networks such as the Internet, private networks such as an enterprise intranet, and so forth), a circuit-switched network (e.g., the public switched telephone network), or a combination of a packet-switched network and a circuit-switched network (with suitable gateways and translators).

The communications framework 1006 may implement various network interfaces arranged to accept, communicate, and connect to a communications network. A network interface may be regarded as a specialized form of an input output interface. Network interfaces may employ connection protocols including without limitation direct connect, Ethernet (e.g., thick, thin, twisted pair 10/100/1000 Base T, and the like), token ring, wireless network interfaces, cellular network interfaces, IEEE 802.11a-x network interfaces, IEEE 802.16 network interfaces, IEEE 802.20 network interfaces, and the like. Further, multiple network interfaces may be used to engage with various communications network types. For example, multiple network interfaces may be employed to allow for the communication over broadcast, multicast, and unicast networks. Should processing requirements dictate a greater amount speed and capacity, distributed network controller architectures may similarly be employed to pool, load balance, and otherwise increase the communicative bandwidth required by clients 1002 and the servers 1004. A communications network may be any one and the combination of wired and/or wireless networks including without limitation a direct interconnection, a secured custom connection, a private network (e.g., an enterprise intranet), a public network (e.g., the Internet), a Personal Area Network (PAN), a Local Area Network (LAN), a Metropolitan Area Network (MAN), an Operating Missions as Nodes on the Internet (OMNI), a Wide Area Network (WAN), a wireless network, a cellular network, and other communications networks.

Various embodiments may be implemented using hardware elements, software elements, or a combination of both.

Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following examples pertain to further embodiments:

Example 1 is an apparatus to provide parallel data compression, the apparatus comprising a processor; and a non-transitory, computer-readable storage medium in operable communication with the processor, wherein the computer-readable storage medium contains one or more programming instructions that, when executed, cause the processor to provide a first data input sequence to a plurality of compression components, determine compression information for the plurality of compression components, and perform a compression process on the first data input sequence via the plurality of compression components to generate at least one data output sequence, the plurality of compression components to perform the compression process in parallel based on the compression information.

Example 2 is the apparatus of Example 1, the one or more programming instructions, when executed, to cause the processor to provide at least one second data input sequence to the plurality of compression components.

Example 3 is the apparatus of Example 1, the compression process comprising one of an LZ77 compression process or a Deflate compression process.

Example 4 is the apparatus of Example 1, the compression process comprising an LZ77 compression process.

Example 5 is the apparatus of Example 1, the compression process comprising a Deflate compression process.

Example 6 is the apparatus of Example 1, the compression information comprising a compression level.

Example 7 is the apparatus of Example 1, the compression information comprising a compression level indicating a compression ratio of at least gzip compression level 9.

Example 8 is the apparatus of Example 1, the compression information comprising a number of active compression components, a start offset, and a skip value.

Example 9 is the apparatus of Example 1, the plurality of compression components to compress the first data input sequence at a same compression level.

Example 10 is the apparatus of Example 1, at least a portion of the plurality of compression components to compress the first data input sequence at a different compression level.

Example 11 is the apparatus of Example 1, the one or more programming instructions, when executed, to cause the processor to receive a compression mode indicator to cause the compression process to switch between a parallel multi-sequence compression process and a parallel single-sequence compression process Example 12 is the apparatus of Example 1, the first data input sequence comprising at least one data stream.

Example 13 is the apparatus of Example 1, the at least one data output sequence comprising at least one data stream.

Example 14 is the apparatus of Example 1, the first data input sequence comprising a plurality of data input sequences.

Example 15 is the apparatus of Example 1, the first data input sequence comprising a single data input sequence.

Example 16 is the apparatus of Example 1, the compression process comprising at least one of a parallel multi-sequence compression process and a parallel single-sequence compression process.

Example 17 is the apparatus of Example 1, the compression process comprising a parallel multi-sequence compression process.

Example 18 is the apparatus of Example 1, the compression process comprising a parallel single-sequence compression process.

Example 19 is the apparatus of Example 1, the one or more programming instructions, when executed, to cause the processor to provide a different sequence of a plurality of data input sequences to each of the plurality of compression components to perform a parallel multi-sequence compression process.

Example 20 is the apparatus of Example 1, the one or more programming instructions, when executed, to cause the processor to provide a single data input sequence to each of the plurality of compression components to perform a parallel single-sequence compression process.

Example 21 is the apparatus of Example 1, the one or more programming instructions, when executed, to cause the processor to generate a plurality of data output sequences, each of the plurality of data output sequences generated by a different one of the plurality of compression components.

Example 22 is the apparatus of Example 1, the one or more programming instructions, when executed, to cause the processor to demultiplex a single data input sequence into a plurality of duplicate data input sequences, each of the plurality of compression components to receive one of the plurality of duplicate data input sequences.

Example 23 is the apparatus of Example 1, the plurality of compression components to generate a plurality of compression records.

Example 24 is the apparatus of Example 1, the plurality of compression components to generate a plurality of compression records, each of the plurality of compression records comprising a match indicator, a literal indicator, encoding data, and a match score.

Example 25 is the apparatus of Example 1, the plurality of compression components to generate a plurality of compression records, each of the plurality of compression records comprising a match score to indicate a value indicating a quality of a match associated with a compression record.

Example 26 is the apparatus of Example 1, the one or more programming instructions, when executed, to cause the processor to perform a lazy matching process on a plurality of compression records generated by the plurality of compression components.

Example 27 is the apparatus of Example 1, the one or more programming instructions, when executed, to cause the processor to merge a plurality of compression records generated by the plurality of compression components to generate a single data output.

Example 28 is the apparatus of Example 1, the one or more programming instructions, when executed, to cause the processor to provide a start position having a different offset value for each of the plurality of compression components.

Example 29 is the apparatus of Example 1, the one or more programming instructions, when executed, to cause the processor to provide a start position having a different offset value for each of the plurality of compression components, the start position based on a number of the plurality of compression components.

Example 30 is the apparatus of Example 1, the one or more programming instructions, when executed, to cause the processor to provide a skip value for each of the plurality of compression components.

Example 31 is the apparatus of Example 1, the one or more programming instructions, when executed, to cause the processor to provide a skip value for each of the plurality of compression components, the skip value configured based on a number of the plurality of compression components.

Example 32 is the apparatus of Example 1, the one or more programming instructions, when executed, to cause the processor to provide a skip value for each of the plurality of compression components, the skip value equal to a number of the plurality of compression components.

Example 33 is a system for parallel compression, comprising the apparatus according to any of Examples 1-30, and at least one network interface.

Example 34 is a method to provide parallel data compression, the method comprising providing a first data input sequence to a plurality of compression components, determining compression information for the plurality of compression components, and performing a compression process on the first data input sequence via the plurality of compression components to generate at least one data output sequence, the plurality of compression components to perform the compression process in parallel based on the compression information.

Example 35 is the method of Example 34, comprising providing at least one second data input sequence to the plurality of compression components.

Example 36 is the method of Example 34, the compression process comprising one of an LZ77 compression process or a Deflate compression process.

Example 37 is the method of Example 34, the compression process comprising an LZ77 compression process.

Example 38 is the method of Example 34, the compression process comprising a Deflate compression process.

Example 39 is the method of Example 34, the compression information comprising a compression level.

Example 40 is the method of Example 34, the compression information comprising a compression level indicating a compression ratio of at least gzip compression level 9.

Example 41 is the method of Example 34, the compression information comprising a number of active compression components, a start offset, and a skip value.

Example 42 is the method of Example 34, the plurality of compression components to compress the first data input sequence at a same compression level.

Example 43 is the method of Example 34, at least a portion of the plurality of compression components to compress the first data input sequence at a different compression level.

Example 44 is the method of Example 34, the first data input sequence comprising at least one data stream.

Example 45 is the method of Example 34, the at least one data output sequence comprising at least one data stream.

Example 46 is the method of Example 34, the first data input sequence comprising a plurality of data input sequences.

Example 47 is the method of Example 34, the first data input sequence comprising a single data input sequence.

Example 48 is the method of Example 34, the compression process comprising at least one of a parallel multi-sequence compression process and a parallel single-sequence compression process.

Example 49 is the method of Example 34, the compression process comprising a parallel multi-sequence compression process.

Example 50 is the method of Example 34, the compression process comprising a parallel single-sequence compression process.

Example 51 is the method of Example 34, comprising providing a different sequence of a plurality of data input sequences to each of the plurality of compression components to perform a parallel multi-sequence compression process.

Example 52 is the method of Example 34, comprising providing a single data input sequence to each of the plurality of compression components to perform a parallel single-sequence compression process.

Example 53 is the method of Example 34, comprising generating a plurality of data output sequences, each of the plurality of data output sequences generated by a different one of the plurality of compression components.

Example 54 is the method of Example 34, comprising demultiplexing a single data input sequence into a plurality of duplicate data input sequences, each of the plurality of compression components to receive one of the plurality of duplicate data input sequences.

Example 55 is the method of Example 34, the plurality of compression components to generate a plurality of compression records.

Example 56 is the method of Example 34, the plurality of compression components to generate a plurality of compression records, each of the plurality of compression records comprising a match indicator, a literal indicator, encoding data, and a match score.

Example 57 is the method of Example 34, the plurality of compression components to generate a plurality of compression records, each of the plurality of compression records comprising a match score to indicate a value indicating a quality of a match associated with a compression record.

Example 58 is the method of Example 34, comprising performing a lazy matching process on a plurality of compression records generated by the plurality of compression components.

Example 59 is the method of Example 34, comprising merging a plurality of compression records generated by the plurality of compression components to generate a single data output.

Example 60 is the method of Example 34, comprising providing a start position having a different offset value for each of the plurality of compression components.

Example 61 is the method of Example 34, comprising providing a start position having a different offset value for each of the plurality of compression components, the start position based on a number of the plurality of compression components.

Example 62 is the method of Example 34, comprising providing a skip value for each of the plurality of compression components.

Example 63 is the method of Example 34, comprising providing a skip value for each of the plurality of compression components, the skip value configured based on a number of the plurality of compression components.

Example 64 is the method of Example 34, comprising providing a skip value for each of the plurality of compression components, the skip value equal to a number of the plurality of compression components.

Example 65 is a system for parallel compression, comprising an apparatus operative to perform a method according to any of claims 32-61, and at least one network interface.

Example 66 is a computer-readable storage medium that stores instructions for execution by processing circuitry of a computing device for parallel compression, the instructions to cause the computing device to provide a first data input sequence to a plurality of compression components, determine compression information for the plurality of compression components, and perform a compression process on the first data input sequence via the plurality of compression components to generate at least one data output sequence, the plurality of compression components to perform the compression process in parallel based on the compression information.

Example 67 is the computer-readable storage medium of Example 66, the compression process comprising one of an LZ77 compression process or a Deflate compression process.

Example 68 is the computer-readable storage medium of Example 66, the compression process comprising an LZ77 compression process.

Example 69 is the computer-readable storage medium of Example 66, the compression process comprising a Deflate compression process.

Example 70 is the computer-readable storage medium of Example 66, the compression information comprising a compression level.

Example 71 is the computer-readable storage medium of Example 66, the compression information comprising a compression level indicating a compression ratio of at least gzip compression level 9.

Example 72 is the computer-readable storage medium of Example 66, the compression information comprising a number of active compression components, a start offset, and a skip value.

Example 73 is the computer-readable storage medium of Example 66, the plurality of compression components to compress the first data input sequence at a same compression level.

Example 74 is the computer-readable storage medium of Example 66, at least a portion of the plurality of compression components to compress the first data input sequence at a different compression level.

Example 75 is the computer-readable storage medium of Example 66, the first data input sequence comprising at least one data stream.

Example 76 is the computer-readable storage medium of Example 66, the at least one data output sequence comprising at least one data stream.

Example 77 is the computer-readable storage medium of Example 66, the first data input sequence comprising a plurality of data input sequences.

Example 78 is the computer-readable storage medium of Example 66, the first data input sequence comprising a single data input sequence.

Example 79 is the computer-readable storage medium of Example 66, the compression process comprising at least one of a parallel multi-sequence compression process and a parallel single-sequence compression process.

Example 80 is the computer-readable storage medium of Example 66, the compression process comprising a parallel multi-sequence compression process.

Example 81 is the computer-readable storage medium of Example 66, the compression process comprising a parallel single-sequence compression process.

Example 82 is the computer-readable storage medium of Example 66, the instructions to cause the computing device to provide a different sequence of a plurality of data input sequences to each of the plurality of compression components to perform a parallel multi-sequence compression process.

Example 83 is the computer-readable storage medium of Example 66, the instructions to cause the computing device to provide a single data input sequence to each of the plurality of compression components to perform a parallel single-sequence compression process.

Example 84 is the computer-readable storage medium of Example 66, the instructions to cause the computing device to generate a plurality of data output sequences, each of the plurality of data output sequences generated by a different one of the plurality of compression components.

Example 85 is the computer-readable storage medium of Example 66, the instructions to cause the computing device to demultiplex a single data input sequence into a plurality of duplicate data input sequences, each of the plurality of compression components to receive one of the plurality of duplicate data input sequences.

Example 86 is the computer-readable storage medium of Example 66, the plurality of compression components to generate a plurality of compression records.

Example 87 is the computer-readable storage medium of Example 66, the plurality of compression components to generate a plurality of compression records, each of the plurality of compression records comprising a match indicator, a literal indicator, encoding data, and a match score.

Example 88 is the computer-readable storage medium of Example 66, the plurality of compression components to generate a plurality of compression records, each of the plurality of compression records comprising a match score to indicate a value indicating a quality of a match associated with a compression record.

Example 89 is the computer-readable storage medium of Example 66, the instructions to cause the computing device to perform a lazy matching process on a plurality of compression records generated by the plurality of compression components.

Example 90 is the computer-readable storage medium of Example 66, the instructions to cause the computing device to merge a plurality of compression records generated by the plurality of compression components to generate a single data output.

Example 91 is the computer-readable storage medium of Example 66, the instructions to cause the computing device to provide a start position having a different offset value for each of the plurality of compression components.

Example 92 is the computer-readable storage medium of Example 66, the instructions to cause the computing device to provide a start position having a different offset value for each of the plurality of compression components, the start position based on a number of the plurality of compression components.

Example 93 is the computer-readable storage medium of Example 66, the instructions to cause the computing device to provide a skip value for each of the plurality of compression components.

Example 94 is the computer-readable storage medium of Example 66, the instructions to cause the computing device to provide a skip value for each of the plurality of compression components, the skip value configured based on a number of the plurality of compression components.

Example 95 is the computer-readable storage medium of Example 66, the instructions to cause the computing device to provide a skip value for each of the plurality of compression components, the skip value equal to a number of the plurality of compression components.

Example 96 is an apparatus to provide parallel data compression, the apparatus comprising an input means to provide a first data input sequence to a plurality of compression components, a determination means determine compression information for the plurality of compression components, and a compression means perform a compression process on the first data input sequence via the plurality of compression components to generate at least one data output sequence, the plurality of compression components to perform the compression process in parallel based on the compression information.

Example 97 is the apparatus of Example 96, the compression process comprising one of an LZ77 compression process or a Deflate compression process.

Example 98 is the apparatus of Example 96, the compression process comprising an LZ77 compression process.

Example 99 is the apparatus of Example 96, the compression process comprising a Deflate compression process.

Example 100 is the apparatus of Example 96, the compression information comprising a compression level.

Example 101 is the apparatus of Example 96, the compression information comprising a compression level indicating a compression ratio of at least gzip compression level 9.

Example 102 is the apparatus of Example 96, the compression information comprising a number of active compression components, a start offset, and a skip value.

Example 103 is the apparatus of Example 96, the plurality of compression components to compress the first data input sequence at a same compression level.

Example 104 is the apparatus of Example 96, at least a portion of the plurality of compression components to compress the first data input sequence at a different compression level.

Example 105 is the apparatus of Example 96, the first data input sequence comprising at least one data stream.

Example 106 is the apparatus of Example 96, the at least one data output sequence comprising at least one data stream.

Example 107 is the apparatus of Example 96, the first data input sequence comprising a plurality of data input sequences.

Example 108 is the apparatus of Example 96, the first data input sequence comprising a single data input sequence.

Example 109 is the apparatus of Example 96, the compression process comprising at least one of a parallel multi-sequence compression process and a parallel single-sequence compression process.

Example 110 is the apparatus of Example 96, the compression process comprising a parallel multi-sequence compression process.

Example 111 is the apparatus of Example 96, the compression process comprising a parallel single-sequence compression process.

Example 112 is the apparatus of Example 96, the input means to provide a different sequence of a plurality of data input sequences to each of the plurality of compression components to perform a parallel multi-sequence compression process.

Example 113 is the apparatus of Example 96, the input means to provide a single data input sequence to each of the plurality of compression components to perform a parallel single-sequence compression process.

Example 114 is the apparatus of Example 96, the compression means to generate a plurality of data output sequences, each of the plurality of data output sequences generated by a different one of the plurality of compression components.

Example 115 is the apparatus of Example 96, the compression means to demultiplex a single data input sequence into a plurality of duplicate data input sequences, each of the plurality of compression components to receive one of the plurality of duplicate data input sequences.

Example 116 is the apparatus of Example 96, the plurality of compression components to generate a plurality of compression records.

Example 117 is the apparatus of Example 96, the plurality of compression components to generate a plurality of compression records, each of the plurality of compression records comprising a match indicator, a literal indicator, encoding data, and a match score.

Example 118 is the apparatus of Example 96, the plurality of compression components to generate a plurality of compression records, each of the plurality of compression records comprising a match score to indicate a value indicating a quality of a match associated with a compression record.

Example 119 is the apparatus of Example 96, the compression means to perform a lazy matching process on a plurality of compression records generated by the plurality of compression components.

Example 120 is the apparatus of Example 96, the compression means to merge a plurality of compression records generated by the plurality of compression components to generate a single data output.

Example 121 is the apparatus of Example 96, the compression means to provide a start position having a different offset value for each of the plurality of compression components.

Example 122 is the apparatus of Example 96, the compression means to provide a start position having a different offset value for each of the plurality of compression components, the start position based on a number of the plurality of compression components.

Example 123 is the apparatus of Example 96, the compression means to provide a skip value for each of the plurality of compression components.

Example 124 is the apparatus of Example 96, the compression means to provide a skip value for each of the plurality of compression components, the skip value configured based on a number of the plurality of compression components.

Example 125 is the apparatus of Example 96, the compression means to provide a skip value for each of the plurality of compression components, the skip value equal to a number of the plurality of compression components.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus to provide parallel data compression, the apparatus comprising:
    a processor; and
    a non-transitory, computer-readable storage medium in operable communication with the processor, wherein the computer-readable storage medium contains one or more programming instructions that, when executed, cause the processor to:
        provide a first data input sequence to a plurality of compression components,
        determine compression information for the plurality of compression components, and
        perform a compression process on the first data input sequence via the plurality of compression components to generate at least one data output sequence, the plurality of compression components to perform the compression process in parallel based on the compression information.

2. The apparatus of claim 1, the one or more programming instructions, when executed, to cause the processor to provide at least one second data input sequence to the plurality of compression components.

3. The apparatus of claim 1, the compression process comprising one of an LZ77 compression process or a Deflate compression process.

4. The apparatus of claim 1, the compression information comprising a compression level.

5. The apparatus of claim 1, the compression information comprising a number of active compression components, a start offset, and a skip value.

6. The apparatus of claim 1, at least a portion of the plurality of compression components to compress the first data input sequence at a different compression level.

7. The apparatus of claim 1, the first data input sequence comprising a plurality of data input sequences.

8. The apparatus of claim 1, the compression process comprising at least one of a parallel multi-sequence compression process and a parallel single-sequence compression process.

9. The apparatus of claim 1, the one or more programming instructions, when executed, to cause the processor to receive a compression mode indicator to cause the compression process to switch between a parallel multi-sequence compression process and a parallel single-sequence compression process.

10. The apparatus of claim 1, the one or more programming instructions, when executed, to cause the processor to provide a different sequence of a plurality of data input sequences to each of the plurality of compression components to perform a parallel multi-sequence compression process.

11. The apparatus of claim 1, the one or more programming instructions, when executed, to cause the processor to provide a single data input sequence to each of the plurality of compression components to perform a parallel single-sequence compression process.

12. The apparatus of claim 1, the plurality of compression components to generate a plurality of compression records.

13. The apparatus of claim 1, the one or more programming instructions, when executed, to cause the processor to perform a lazy matching process on a plurality of compression records generated by the plurality of compression components.

14. The apparatus of claim 1, the one or more programming instructions, when executed, to cause the processor to merge a plurality of compression records generated by the plurality of compression components to generate a single data output.

15. The apparatus of claim 1, the one or more programming instructions, when executed, to cause the processor to provide a start position having a different offset value for each of the plurality of compression components.

16. The apparatus of claim 1, the one or more programming instructions, when executed, to cause the processor to provide a skip value for each of the plurality of compression components.

17. A method to provide parallel data compression, the method comprising:
   providing a first data input sequence to a plurality of compression components;
   determining compression information for the plurality of compression components; and
   performing a compression process on the first data input sequence via the plurality of compression components to generate at least one data output sequence, the plurality of compression components to perform the compression process in parallel based on the compression information.

18. The method of claim 17, the compression process comprising one of an LZ77 compression process or a Deflate compression process.

19. The method of claim 17, the compression information comprising a compression level.

20. The method of claim 17, at least a portion of the plurality of compression components to compress the first data input sequence at a different compression level.

21. The method of claim 17, the compression process comprising at least one of a parallel multi-sequence compression process and a parallel single-sequence compression process.

22. The method of claim 17, comprising providing a different sequence of a plurality of data input sequences to each of the plurality of compression components to perform a parallel multi-sequence compression process.

23. The method of claim 17, comprising providing a single data input sequence to each of the plurality of compression components to perform a parallel single-sequence compression process.

24. A computer-readable storage medium that stores instructions for execution by processing circuitry of a computing device for parallel compression, the instructions to cause the computing device to:
   provide a first data input sequence to a plurality of compression components,
   determine compression information for the plurality of compression components, and
   perform a compression process on the first input sequence via the plurality of compression components to generate at least one data output sequence, the plurality of compression components to perform the compression process in parallel based on the compression information.

25. The computer-readable storage medium of claim 24, the compression process comprising at least one of a parallel multi-sequence compression process and a parallel single-sequence compression process.

* * * * *